(12) United States Patent
Kazama (10) Patent No.: US 8,981,409 B2
(45) Date of Patent: Mar. 17, 2015

(54) SEMICONDUCTOR LIGHT EMITTING DEVICE (71) Applicant: Stanley Electric Co., Ltd., Meguro-ku, Tokyo (JP)

(72) Inventor: Takuya Kazama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 52 days.

(21) Appl. No.: 13/954,869

(22) Filed: Jul. 30, 2013

(65) Prior Publication Data

US 2014/0034980 A1    Feb. 6, 2014

(30) Foreign Application Priority Data

Aug. 3, 2012  (JP) ................... 2012-172939

(51) Int. Cl.
  *H01L 33/00*  (2010.01)
  *H01L 33/22*  (2010.01)
  *H01L 33/20*  (2010.01)
  *H01L 33/38*  (2010.01)

(52) U.S. Cl.
  CPC ............... *H01L 33/22* (2013.01); *H01L 33/20* (2013.01); *H01L 33/382* (2013.01); *H01L 33/38* (2013.01)
  USPC ......................................................... 257/98

(58) Field of Classification Search
  CPC ........ H01L 33/20; H01L 33/22; H01L 33/382
  USPC ......................................................... 257/98
  See application file for complete search history.

(56) References Cited

U.S. PATENT DOCUMENTS

| | | | |
|---|---|---|---|
| 6,995,030 B2 | 2/2006 | Illek et al. | |
| 7,109,527 B2 | 9/2006 | Illek et al. | |
| 7,897,420 B2 * | 3/2011 | Chu et al. | ........................ 438/29 |
| 8,040,463 B2 | 10/2011 | Kazama | |
| 2002/0017652 A1 | 2/2002 | Illek et al. | |
| 2006/0180820 A1 | 8/2006 | Illek et al. | |
| 2012/0007118 A1 * | 1/2012 | Choi et al. | ...................... 257/98 |

FOREIGN PATENT DOCUMENTS

| | | |
|---|---|---|
| JP | 2004-297095 A | 10/2004 |
| JP | 2008-282851 A | 11/2008 |
| JP | 2009-010359 A | 1/2009 |
| JP | 4230219 B2 | 2/2009 |
| JP | 2011-165853 A | 8/2011 |

* cited by examiner

*Primary Examiner* — Theresa T Doan
(74) *Attorney, Agent, or Firm* — Holtz, Holtz, Goodman & Chick PC (57) ABSTRACT A semiconductor light emitting device comprises a first groove extending to a first semiconductor layer from a second semiconductor layer side through the second semiconductor layer and a light emitting layer; a first ohmic electrode formed in contact with the first semiconductor layer in the first groove; an insulating layer covering a surface of the second semiconductor layer and at least the surface of part of the light emitting layer exposed in the first groove; a metal layer covering the surface of the insulating layer and connected to the first ohmic electrode; a second groove extending from a first semiconductor layer side through the first semiconductor layer and the light emitting layer to the second semiconductor layer; a second ohmic electrode formed in contact with the second semiconductor layer in the second groove; and a support body bonded to the metal layer via a junction layer.

19 Claims, 6 Drawing Sheets

SEMICONDUCTOR LIGHT EMITTING DEVICE

BACKGROUND OF THE INVENTION

1. Field of the Invention

The present invention relates to a semiconductor light emitting device, and in particular to a light emitting diode (LED) formed by removing the growth substrate after sticking a semiconductor light emitting layer grown on a growth substrate to a support substrate.

2. Description of the Related Art

Conventionally, there have been LEDs (of a metal bonding or MB structure) formed by removing the growth substrate after a semiconductor light emitting laminated body grown on a growth substrate (or temporary substrate) by a vapor deposition method such as a MOCVD (Metal-Organic Chemical Vapor Deposition) method is stuck to a conductive support substrate (or permanent substrate) via a reflective mirror (for example, disclosed in Japanese Patent Application Laid-Open No. 2009-10359). The reflective mirror is provided on the opposite side from the light extraction surface, thereby improving light output extracted to the outside.

As compared with an LED made on a conductive growth substrate, an LED of the above MB structure is thin in the thickness of the semiconductor layer compared with the chip size, and hence current spread in horizontal directions (in-plane directions) is dominant, so that current is less likely to diffuse. The luminous efficiency of LEDs depends on the density of current injected into the active layer. There is the problem that because carriers injected into the active layer overflows when the current density is high, carriers contributing to light emission decrease in number, resulting in a reduction in the luminous efficiency, thus spoiling the linearity of light emission output against current. In addition, local current constriction causes a problem in reliability because it causes the proliferation of crystal defects by electric field concentration, heat generation, and the like.

Further, there disclosed is a configuration wherein a so-called counter electrode configuration where a light extraction surface side electrode and a reflective surface side electrode are arranged so as not to overlap in top plan view is taken on, thereby promoting current spread in horizontal directions (for example, in Japanese Patent Application Laid-Open No. 2008-282851 or Japanese Patent Application Laid-Open No. 2011-165853).

Yet further, for example, Japanese Patent Publication No. 4230219 discloses a semiconductor light emitting element wherein a mesa is formed in a semiconductor layer and wherein light extraction efficiency is improved using reflection by side surfaces of the mesa. An electrode configuration of an element having an insulating substrate is described in Japanese Patent Application Laid-Open No. 2004-297095.

SUMMARY OF THE INVENTION

However, in the light emitting devices as described above, light emitted from the light emitting layer is blocked by an electrode or subjected to reflection loss due to an electrode, resulting in a reduction in light extraction efficiency and thus a reduction in light output of the light emitting device.

The present invention has been made in view of the above facts, and an object thereof is to improve the efficiency of light extraction through the light extraction surface and provide a semiconductor light emitting device of high output, and also to improve in-plane current spread and provide a semiconductor light emitting device small in carrier overflow and having high luminous efficiency and high light output linearity which is of high reliability and less likely to degrade.

According to the present invention, there is provided a light emitting device which has a semiconductor structure layer having a first semiconductor layer, a light emitting layer, and a second semiconductor layer of a conductivity type opposite to that of the first semiconductor layer sequentially laid one over another, a surface of the first semiconductor layer being a light extraction surface. The light emitting device comprises a first groove extending from a second semiconductor layer side through the second semiconductor layer and the light emitting layer to the first semiconductor layer; a first ohmic electrode formed in contact with the first semiconductor layer in the first groove; an insulating layer covering a surface of the second semiconductor layer and at least the surface of part of the light emitting layer exposed in the first groove; a metal layer covering the surface of the insulating layer and connected to the first ohmic electrode; a second groove extending from a first semiconductor layer side through the first semiconductor layer and the light emitting layer to the second semiconductor layer; a second ohmic electrode formed in contact with the second semiconductor layer in the second groove; and a support body bonded to the metal layer via a junction layer.

DETAILED DESCRIPTION OF THE INVENTION

In the embodiments described below, for ease of description and understanding, there will be described the case where a semiconductor structure layer consists of a first semiconductor layer, a light emitting layer, and a second semiconductor layer, the first semiconductor layer being an n-clad layer, the second semiconductor layer consisting of a p-clad layer and a p-contact layer, but the present invention is not limited to this configuration. That is, the first semiconductor layer and/or the second semiconductor layer, and the light emitting layer may each consist of a plurality of layers. For example, the semiconductor layer may include a carrier injection layer, a barrier layer for preventing carrier overflow, a current spread layer, a contact layer for improving ohmic contactability, a buffer layer, and the like. Or, the second semiconductor layer may be constituted by a single layer. Further, the conductivity types of the first and second semiconductor layers may be the opposite of those in the embodiments below.

Preferred embodiments of the present invention will be described below, and these may be altered as needed and combined together. The same reference numerals are used to denote substantially the same or equivalent parts throughout the description below and the accompanying drawings.

Embodiment 1

Figure 1:
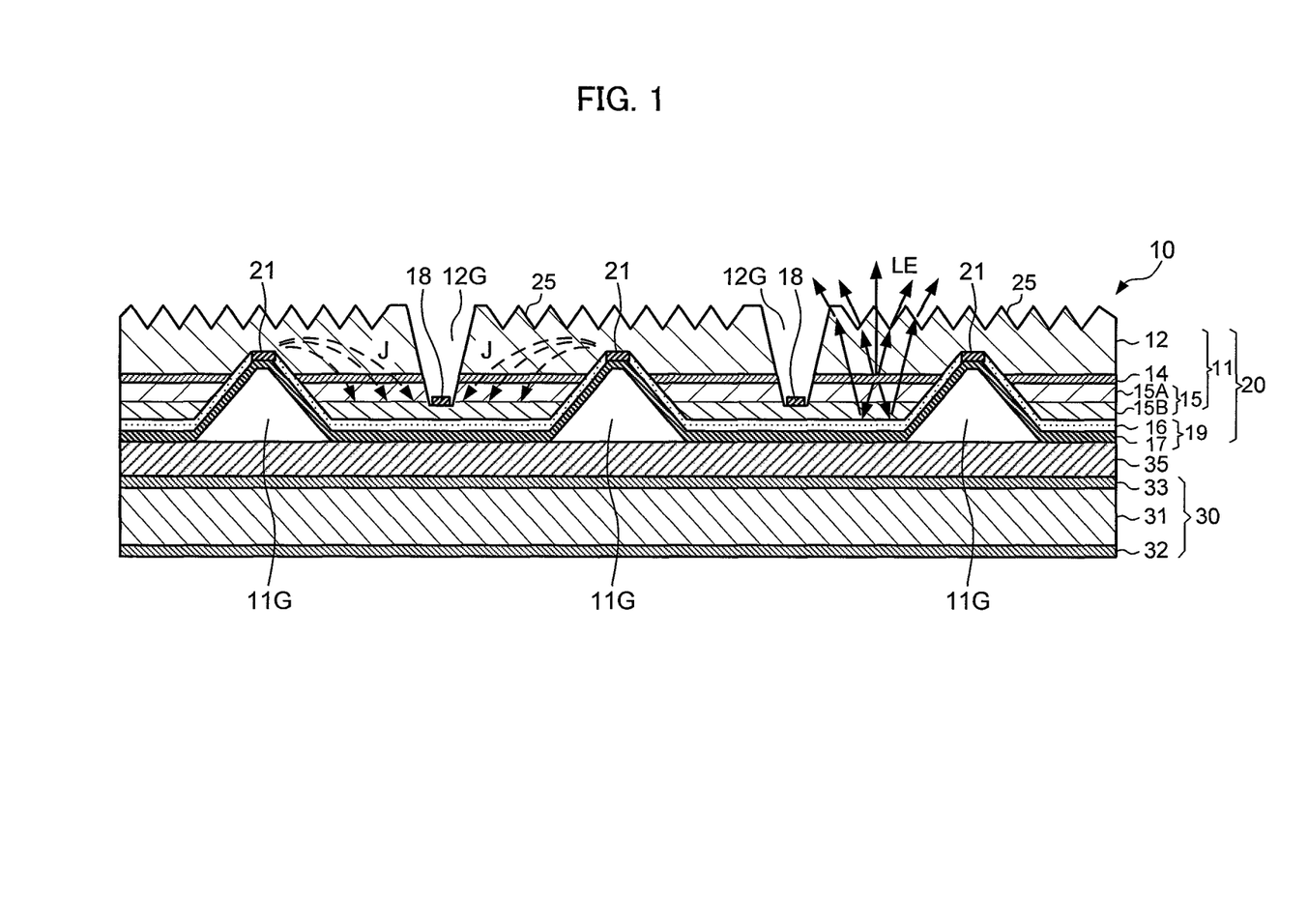
FIG. 1 is a cross-sectional view schematically showing a light emitting device that is Embodiment 1 of the present invention.

FIG. 1 is a cross-sectional view schematically showing a light emitting device 10 that is Embodiment 1 of the present invention. The light emitting device 10 is an AlGaInP-based light emitting diode (LED) 10 having a structure in which a light emitting element structure 20 and a support body 30 are bonded via a junction layer 35.

More specifically, the light emitting element structure (hereinafter also called simply an element structure) 20 has a semiconductor structure layer 11 that is a light emitting function layer composed of a first semiconductor layer 12 of a first conductivity type, a light emitting layer 14, and a second semiconductor layer 15 of a second conductivity type that is the opposite of the first conductivity type. In the present embodiment, description will be made taking as an example the case where the first semiconductor layer 12 is an n-type semiconductor layer and where the second semiconductor layer 15 is a p-type semiconductor layer.

Further, an insulating layer 16 made of $SiO_2$, SiN, or the like is formed on the second semiconductor layer 15, and a metal layer 17 made of a metal of high optical reflectivity such as Ag is formed on the insulating layer 16. And the laminated structure of the insulating layer 16 and the metal layer 17 constitutes a reflective layer 19 that reflects light from the light emitting layer 14.

In the semiconductor structure layer 11, a plurality of grooves 11G (first grooves) are formed which extend from a second semiconductor layer 15 (p-contact layer 15B and p-clad layer 15A) side through the second semiconductor layer 15 and the light emitting layer 14 to the first semiconductor layer (n-clad layer) 12. The surface of the second semiconductor layer 15 and the exposed surfaces in the grooves 11G of the semiconductor structure layer 11 are covered with the insulating layer 16 and the metal layer 17. That is, the back surface of the semiconductor structure layer 11 (the opposite surface to the surface of the first semiconductor layer 12) is entirely covered with the insulating layer 16 and the metal layer 17. Note that the insulating layer 16 need only be formed to insulate at least the exposed surfaces in the grooves 11G of the light emitting layer 14 from among the exposed surfaces in the grooves 11G of the semiconductor structure layer 11.

In the first grooves 11G, there are provided n-electrodes 21 (first ohmic electrodes) forming ohmic contact with the n-clad layer 12 and electrically connected to the metal layer 17 through openings in the insulating layer 16. The n-electrodes 21 are provided at, e.g., the bottom of the plurality of grooves 11G respectively.

Further, a plurality of grooves 12G (second grooves) are formed which extend from the surface of the first semiconductor layer (n-clad layer) 12 through the first semiconductor layer (n-clad layer) 12 and the light emitting layer 14 to the p-contact layer 15B of the second semiconductor layer 15. In the grooves 12G, there are provided p-electrodes 18 (second ohmic electrodes) forming ohmic contact with the p-contact layer 15B. The p-electrodes 18 are provided at, e.g., the bottom of the plurality of grooves 12G respectively. Note that the exposed surfaces in the grooves 12G of the semiconductor structure layer 11 may be covered with an insulating layer and that the insulating layer need only be formed to insulate at least the parts exposed by forming the grooves 12G of the light emitting layer 14.

Further, a light extraction structure 25 is formed by hole/protrusion processing in the surface of the n-clad layer 12 that is the light extraction surface. The holes and protrusions in the light extraction structure 25 may be random or periodic in arrangement. The protrusions and holes can be constituted by pyramid- or column-shaped protrusions and hollows or so on. When the size (dimension or period A) of the holes and protrusions satisfies $1.0\lambda 0/n \leq A \leq 10.0\lambda 0/n$ and the height (B) satisfies $0.5A \leq B \leq 1.5A$, a high light extraction effect can be obtained, where $\lambda 0$ is the wavelength in a vacuum and n is the refractive index of the semiconductor layer at the emission wavelength. For example, for an AlGaInP-based material, $n=3.3$ at $\lambda 0=625$ nm (nanometers), and the size A is about 200 to 2000 nm.

The support body 30, as shown in FIG. 1, has a conductive support substrate 31, an ohmic electrode 32 formed on one principal surface of the support substrate 31 (the back surface of LED 10), and an ohmic electrode 33 formed on the other principal surface, and is bonded to the element structure 20 via a junction layer 35 that is a metal layer formed on the ohmic electrode 33.

Figure 2A:
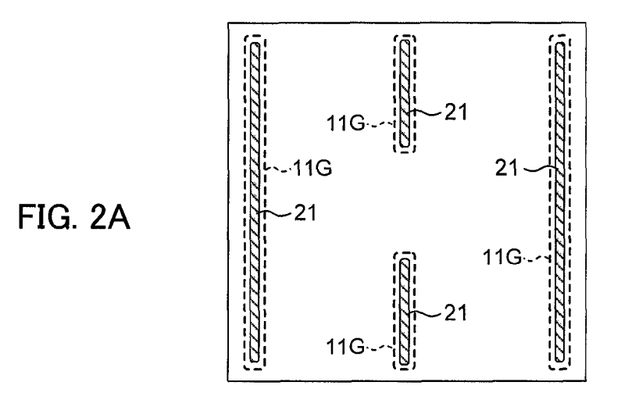
FIGS. 2A, 2B, 2C are plan views schematically showing the electrode configuration of the light emitting device (LED) of Embodiment 1.
Figure 2B:
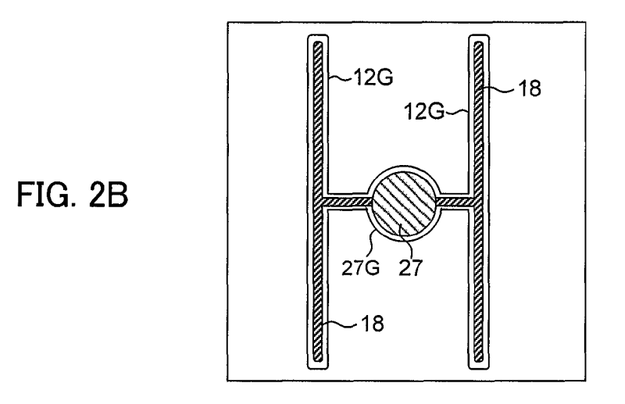
Figure 2C:
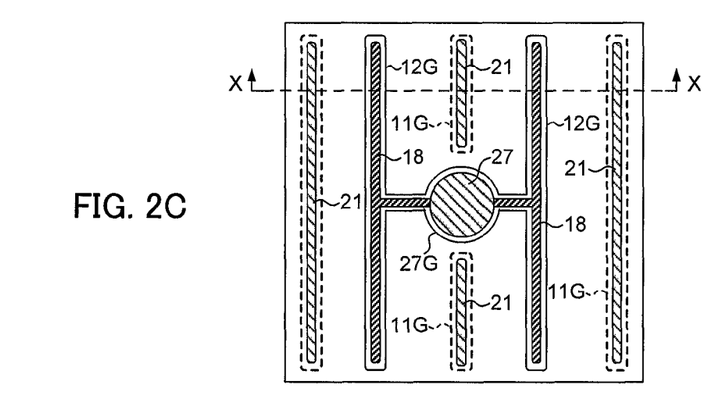

FIGS. 2A, 2B, 2C are plan views schematically showing the electrode configuration of the light emitting device (LED) 10 of Embodiment 1. Note that FIG. 1 is a cross-sectional view along line X-X in FIG. 2C. More specifically, FIG. 2A schematically shows the electrode configuration for where the n-electrodes 21 and grooves 11G of the LED 10 are projected onto a plane parallel to the crystal growth surface (or semiconductor structure layer). FIG. 2B shows the p-electrodes 18 and grooves 12G and in addition a p-pad electrode 27 connected to the p-electrodes 18. As shown in FIG. 2B, the pad electrode 27 is connected at some places to the p-electrodes 18. The pad electrode 27 is formed as a Schottky electrode for the p-clad layer 15, and a feed wire is externally connected to the pad electrode 27 for feeding.

FIG. 2C schematically shows the electrode configuration for where the p-electrodes 18, the n-electrodes 21, and the p-pad electrode 27 are projected onto a plane parallel to the crystal growth surface. That is, FIG. 2C is a combined view of FIGS. 2A and 2B. As shown in FIG. 2C, the n-electrodes 21 that are ohmic electrodes for the n-clad layer 12 and the p-electrodes 18 that are ohmic electrodes for the p-contact layer 15B are arranged so as not to overlap each other on the projection plane, that is, in top plan view as seen in a direction perpendicular to the surface of the n-clad layer 12 that is the light extraction surface. The p-electrodes 18 and the n-electrodes 21 constitute electrodes (counter electrodes) in a so-called counter arrangement.

The ohmic electrode 32 that is the electrode on the n-side of the LED 10 is electrically connected to the n-electrodes 21 via the conductive support substrate 31, the ohmic electrode 33, the junction layer 35 that is a metal layer, and the metal layer 17 forming part of the reflective layer. Although the case where the grooves 11G, 12G, the n-electrodes 21, and the p-electrodes 18 are formed in linear shapes is illustrated, they may be arranged otherwise, for example, in concentric circle shapes.

Thus, a voltage applied between the ohmic electrode 32 that is a p-electrode and the p-pad electrode 27 that is a Schottky electrode, causes current to flow between the p-electrodes 18 and the n-electrodes 21, so that the light emitting layer 14 emits light. In FIG. 1, paths of current (electron flow) J from the n-electrodes 21 to the p-electrodes 18 are indicated schematically by broken-line arrows. As described above, the n-electrode 21 is provided in the groove 11G (at the bottom), and the p-electrode 18 is provided in the groove 12G (at the bottom), and hence the electrodes of the LED 10 have a so-called counter electrode configuration, so that with the electrodes of small coverage (area coverage), efficient current spread in in-plane directions in the semiconductor layer can be achieved.

As described above, according to the present embodiment, the first grooves 11G extending from the reflective layer 19 side through the second semiconductor layer (p-contact layer and p-clad layer) 15 and the light emitting layer 14 to the first semiconductor layer (n-clad layer) 12 are formed in the semiconductor structure layer 11. And the ohmic electrode (n-electrode) 21 of the first conductivity type is formed at the bottom of the groove 11G (or the part contacting the first semiconductor layer 12). Further, the second grooves 12G extending from the first semiconductor layer 12 side through the first semiconductor layer 12 and the light emitting layer 14 to the second semiconductor layer 15 are formed in the semiconductor structure layer 11. And the ohmic electrode (p-electrode) 18 of the second conductivity type is formed at the bottom of the groove 12G (or the part contacting the second semiconductor layer 15).

That is, the light emitting layer 14 has been removed from the region where the groove 11G is formed, and the n-electrode 21 is formed contacting the n-clad layer 12. In other words, parts of the light emitting layer 14 and the p-clad layer 15 on the reflective layer 19 side of the n-electrode 21 that is an electrode on the light extraction surface side are removed, and hence light emitted from the light emitting layer 14 can be extracted without being blocked by the n-electrodes 21 that are the electrodes on the light extraction surface side.

Further, the grooves 12G extending from the surface of the first semiconductor layer (n-clad layer) 12 that is the light extraction surface through the light emitting layer 14 to the p-contact layer 15B of the second semiconductor layer 15 are formed. In the groove 12G, the p-electrode 18 forming ohmic contact with the p-contact layer 15B is provided. That is, the light emitting layer 14 has been removed from the region where the groove 12G is formed, and the ohmic electrode (p-electrode) 18 of the second conductivity type is formed in the second semiconductor layer 15 (p-contact layer 15B). In other words, in the region where the groove 12G is formed, an electrode (ohmic electrode) of low reflectivity does not exist under the light emitting layer 14, that is, on the reflective layer 19 side of the light emitting layer 14, and hence reflection loss due to the electrode is reduced, and the light output of the LED can be improved.

[Manufacturing Method of Light Emitting Device 10]

Figure 3:
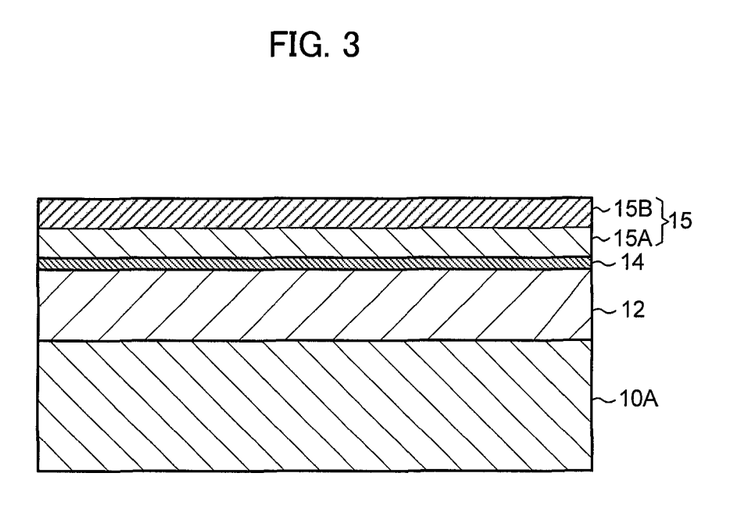
FIG. 3 is a cross-sectional view schematically showing the semiconductor structure layer of the light emitting device of Embodiment 1.

A manufacturing method of the light emitting device 10 according to Embodiment 1 will be described in detail below taking as an example the case of an AlGaInP-based light emitting diode (LED). FIG. 3 is a cross-sectional view schematically showing the semiconductor structure layer 11 of the light emitting device (LED) 10 of Embodiment 1.

(1) Semiconductor Structure Layer

Crystal growth was performed using an MOCVD (Metal-Organic Chemical Vapor Deposition) method. An n-type GaAs substrate of 15° in off angle was used as a growth substrate 10A. More specifically, an n-clad layer (($Al_zGa_{1-z}$)$_{0.5}In_{0.5}$P layer) 12 of 4 μm (micrometers) thickness, a light emitting layer 14 of 0.5 μm thickness, a p-clad layer 15A of ($Al_zGa_{1-z}$)$_{0.5}In_{0.5}$P (z=1.0) in composition and 1.0 μm thickness, and a p-contact layer 15B of $Ga_{1-x}In_xP$ (x=0.1) in composition and 1.5 μm thickness are sequentially epitaxial-grown in that order one over another on a (100) plane of the GaAs growth substrate 10A. Note that the composition x of the $Ga_{1-x}In_xP$ contact layer 15B is decided under the condition that light emitted from the light emitting layer 14 not be absorbed. The carrier concentration of the n-clad layer 12 was set at $2×10^{18}$ cm$^{-3}$ (hereinafter may be expressed in exponent notation like 2E18 cm$^{-3}$), and the carrier concentration of the p-clad layer 15A was set at $2×10^{18}$ cm$^{-3}$.

The light emitting layer 14 may be a multiple quantum well (MQW) layer, a single quantum well (SQW) layer, or a single layer (so-called bulk layer). For example, the multiple quantum well structure is composed of 15 pairs of a well layer and a barrier layer, the well layer being a ($Al_zGa_{1-z}$)$_{0.5}In_{0.5}$P layer (composition z=0.10, 20 nm thickness), the barrier layer being a ($Al_zGa_{1-z}$)$_{0.5}In_{0.5}$P layer (composition z=0.56, 10 nm thickness). Note that the Al composition z of the well layer is adjusted within the range of 0≤z≤0.4 according to the emission wavelength and that the Al compositions z of the n-clad layer 12 and the p-clad layer 15A are adjusted within the range of 0.4≤z≤1.0.

The total thickness of the semiconductor structure layer 11 was set at 7.0 μm. The n-clad layer 12, the light emitting layer 14, the p-clad layer 15A, and the p-contact layer 15B match the GaAs substrate in lattice.

(2) Formation of the Grooves for the n-Electrodes

The grooves 11G for the n-electrodes are formed by photolithography and dry etching. More specifically, the p-contact layer 15B, the p-clad layer 15A, the light emitting layer 14, and the n-clad layer 12 are partially removed by dry etching. With the processing depth for the n-clad layer 12 being set at 2.0 μm for 4.0 μm thickness of the n-clad layer 12, grooves of 5.0 μm (total etching depth) were formed. For an AlGaInP-based material, in general, it is necessary that the clad layer for electron confinement is 0.5 μm thick each for the p-side and n-side and that the light emitting layer 14 is 0.5 μm thick, and hence for the case of such a layer structure, by forming a groove of 1.5 μm or greater depth, the groove 11G extending through the second semiconductor layer (p-contact layer 15B and p-clad layer 15A) and the light emitting layer 14 to the first semiconductor layer (n-clad layer) 12 can be formed. In the case of the present embodiment, the width of the n-electrode 21 was set at 5.0 μm, and the width of the groove 11G was set at 20 μm. The smaller processing width of the groove means the smaller width of part of the light emitting layer 14 to be removed and thus is more preferable. In the case of the configuration of the present embodiment, if the depth of the groove formed in the n-clad layer 12 because of the groove 11G was 2.0 μm or greater, no increase in the forward voltage was seen.

The inclination angle of the groove 11G is controlled through mask material and dry etching conditions, and in the present embodiment, edge surfaces having an inclination angle α1 (described later) of 30° were formed.

(3) Formation of the Insulating Film

Then, the insulating layer 16 for insulating the junction of the semiconductor structure layer 11 is formed. $SiO_2$ of 320 nm thickness was used for the insulating layer 16. The material for the insulating layer 16 is not limited to $SiO_2$, but may be SiN, $TiO_2$, $Al_2O_3$, or the like. This insulating layer 16 works as a reflective layer together with the metal layer described later. Accordingly, the thickness d of the $SiO_2$ layer is expressed by d=λ0/(4n)×m, where λ0 is the emission wavelength in a vacuum, n is the refractive index of $SiO_2$, and m is an integer. For this embodiment, assuming that λ0=625 nm, n=1.45, and m=3.0, then d=320 nm.

(4) Formation of the n-Electrodes

The n-electrodes 21 that are ohmic electrodes for the n-clad layer 12 are formed at positions for electrode formation in the grooves 11G. Specifically, they are formed by patterning the insulating layer 16 to make openings at the positions for electrode formation (for example, in the bottom of the grooves 11G) and forming a metal film in the openings. AuGeNi was used as material to form ohmic contact with the n-type semiconductor (n-clad layer 12), and the coverage by the electrodes for the element area (i.e., emission area) was set at 5%. Although AuGeNi was used as material to form ohmic contact with the n-type semiconductor, instead AuGe, AuSn, AuSnNi, or the like can be used to form the n-electrodes 21. AuGeNi is a representative material as the n-ohmic material for the AlGaInP-based semiconductor, with which contact of low resistance can be obtained, but AuGeNi requires heat treatment of 400° C. or higher, and an alloy layer to absorb light from the light emitting layer is formed by the heat treatment. However, with the configuration of this embodiment, because the n-electrodes 21 are placed at such positions that they do not block light from the light emitting layer, the absorption by that alloy layer can be avoided.

(5) Formation of the Reflective Metal Layer and a Barrier Layer

Then, an Au film of 300 nm was formed as the reflective metal layer 17. A material of high reflectivity to light from the light emitting layer 14 such as Al or Ag can be used for the reflective metal layer 17. The reflective metal layer 17 and the $SiO_2$ insulating layer 16 form the reflective layer 19. The reflective layer 19 reflects part of light emitted from the light emitting layer 14 to improve light extraction efficiency, which part is directed to the opposite side from the light extraction side. The reflective metal layer 17 is formed to be electrically connected to the n-electrodes 21. By this means, the back surface of the LED 10, that is, the back surface (ohmic metal layer 32) of the conductive support substrate 31 functions as an n-side electrode.

Then, a barrier layer (not shown) is formed over the reflective metal layer 17. More specifically, TaN, TiW, and TaN were sequentially laid one over another by sputtering. The thickness is, for example, 100 nm each for them. The barrier layer can be a single layer or a multi-layer film made of a high melting point metal such as Ta, Ti, or W or a nitride thereof (such as TaN), and a sputtering method or an electron beam (EB) evaporation method may be used for forming the film. The barrier layer is for preventing Zn in AuZn from diffusing outside and also preventing eutectic material from getting (diffusing) into the reflective electrode layer side in a subsequent process. If the barrier layer does not function, the influence of heat in subsequent processes causes degradation in electrical characteristics such as an increase in the forward voltage (Vf) and a reduction in brightness due to a reduction in reflectivity.

Subsequently, a bonding layer (not shown) on the element structure 20 side is formed over the barrier layer by an EB evaporation method. Here, Ni, Au was used, and the thickness was set at 300 nm and 30 nm respectively. Deposition may be performed by a resistance heating evaporation method or a sputtering method. The bonding layer is for improving wettability of the conductive support body 30 with a eutectic junction layer, described later, to form good junction in the later-described process of thermally compression bonding the semiconductor layer and the conductive support substrate.

(6) Bonding to the Support Body

An ohmic metal layer 32 is deposited over one surface of the conductive substrate (Si substrate) 31, and an ohmic metal layer 33, an adhesion layer, a bonding layer, and a eutectic junction layer are sequentially deposited one over another on the other surface to form the conductive support body 30. For example, a silicon (Si) substrate doped with a p-type impurity in a high concentration can be used as the conductive substrate 31, and platinum (Pt) can be used for the ohmic metal layer. The thickness of the ohmic metal layer (Pt) is, for example, 100 to 300 nm. Here, it was 200 nm. Although with the above combination, an ohmic characteristic can be obtained only by depositing the ohmic metal layer, adhesion to the conductive substrate is improved by heating in processes such as a thermal compression bonding described later. Note that instead of Pt, a metal to form ohmic contact with a Si substrate such as Au, Ni, or Ti can be used for the ohmic metal layer. In this case, in order to obtain ohmic contact with the Si substrate, a process of alloying in a nitrogen atmosphere is necessary. Further, the substrate is not limited to a Si substrate, but a conductive material of high thermal conductivity such as Ge, Al, or Cu may be used.

The adhesion layer and the bonding layer are of, e.g., Ti and Ni, and the thickness is 100 to 200 nm and 50 to 150 nm respectively. Here, the thickness of Ti was set at 150 nm and the thickness of Ni was set at 100 nm. For the layer for improving wettability, NiV, Pt, or the like may be used instead of Ni. By providing these layers, the adhesion reliability of the conductive substrate can be increased, and also wettability can be improved in the process of thermally compression bonding to the semiconductor layer, thus preventing the ball-up of the AuSn layer.

AuSn is used for the eutectic junction layer, and its thickness is, for example, 300 to 3000 nm. As to the composition, desirably Au:Sn=about 80 wt %:about 20 wt % (=about 70 at %:about 30%). Here, the thickness of the eutectic junction layer was 600 nm, and AuSn of the above composition was used. The eutectic junction layer need only be made mainly of AuSn, and, for example, an additive may be added to the AuSn. An appropriate technique from among a resistance heating evaporation method, EB evaporation method, sputtering method, and so on can be used as a deposition method.

The element structure 20 and the conductive support body 30 are bonded together by, e.g., thermal compression bonding. More specifically, by thermal compression bonding, that is, by applying such a temperature and pressure that the eutectic material melts, the eutectic junction layer (AuSn layer) of the conductive support body 30 and the above-described bonding layer (NiAu layer) of the element structure 20 form a new junction layer (AuSnNi) 35 to bond the element structure 20 and the conductive support body 30 together. Specifically, the bonding was performed by holding the bonding layer on the element structure 20 side and the eutectic junction layer on the conductive support body 30 side opposite each other and in close contact, in a nitrogen atmosphere under a pressure of about 1 MPa at 330° C. for 10 minutes.

The bonding material, atmosphere when bonding, bonding temperature, and bonding time need only be enough material, atmosphere, temperature, and time to melt the used eutectic material and bond the element structure 20 and the conductive support body 30 without making a change to its characteristics (e.g., degradation in bonding strength due to oxidization or the like), not being limited to the above material, atmosphere, temperature, and time.

(7) Removal of the Growth Substrate

After the element structure 20 and the conductive support body 30 are bonded together, the GaAs growth substrate 10A is removed. The removal of the GaAs growth substrate 10A makes the surface of the n-clad layer 12 exposed to become the light extraction surface. Here, it was removed by wet etching using an ammonia hydrogen peroxide mixture etchant. Note that the removal of the GaAs growth substrate 10A may be performed by dry etching, mechanical polishing, chemical mechanical polishing (CMP), or a combination including at least one of these methods, not being limited to wet etching.

(8) Formation of the Light Extraction Structure

Then, a hole/protrusion structure (photonic crystal) for improving the light extraction efficiency is formed in the n-clad layer 12. First, a mask pattern for an artificial periodic structure is formed on the n-clad layer 12 by a method such as photolithography, EB lithography, EB drawing, nano-imprint, or laser exposure, and a lift-off method. Next, the light extraction structure of cone- or cylinder-shaped protrusions or hollows is formed in the surface of the n-clad layer 12 by dry etching. At this time, in this embodiment, grooves have been made up to a depth of 2.0 μm from the p-side in the n-clad layer 12 (4.0 μm thickness), and hence the light extraction structure needs to be formed within the remaining thickness of 2.0 μm.

Specifically, a cone-shaped photonic crystal, in a triangle lattice array, of a period of 500 nm, a height of 600 nm, and an aspect ratio of 1.2 was formed as the light extraction structure. Note that the photonic crystal need only be structured to be of a period of 200 nm to 2000 nm and an aspect ratio of 0.7 to 1.5.

Instead of the photonic crystal, the light extraction surface may be coarsened by a method such as wet etching to form a light extraction structure. Further, in the above process, a protective mask may be provided, using, e.g., $SiO_2$, on regions on the light extraction surface side where electrodes are to be formed, described later, as needed.

(9) Formation of the Grooves for the p-Electrodes

Next, the grooves 12G for the p-electrodes are formed by photolithography and dry etching. Specifically, the n-clad layer 12 (4.0 μm thickness), the active layer 14 (0.5 μm), the p-clad layer 15A (1.0 μm), and the $Ga_{1-x}In_xP$ contact layer 15B are partially removed by dry etching to form the grooves 12G. The processing depth for the $Ga_{1-x}In_xP$ contact layer 15B was set at 0.5 μm for 1.5 μm thickness of the $Ga_{1-x}In_xP$ contact layer 15B (that is, the total etching depth was 6.5 μm). The inclination angle of the groove 12G is controlled through mask material and dry etching conditions, and in the present embodiment, edge surfaces having an inclination angle α2 (described later) of 70° were formed.

(10) Formation of the p-Ohmic Electrodes and the Pad Electrode

The p-electrodes 18 that are ohmic electrodes are formed on exposed parts of the contact layer 15B through the grooves 12G for the p-electrodes (e.g., in the bottom of the grooves 12G). Specifically, a 330 nm thickness film of AuZn, that is metal that can form ohmic contact, was formed by sputtering, and a 1.5 μm thickness film of Au was formed. Then, heat treatment (alloying) at about 400° C. was performed in a nitrogen atmosphere to form the p-electrodes 18.

AuZn is a representative material as the p-ohmic material for the AlGaInP-based semiconductor, with which contact of low resistance can be obtained, but AuZn requires heat treatment of 300° C. or higher, and an alloy layer to absorb light from the active layer is formed by the heat treatment. However, with the configuration of this embodiment, because the p-electrodes 18 are placed at such positions that they do not block light from the active layer 14, the absorption by that alloy layer can be avoided.

Further, the pad electrode 27 connected to the p-electrodes 18 are formed. The pad electrode 27 has a predetermined shape (in FIG. 2B, a circular shape). The semiconductor layer is etched down to, e.g., the same depth as that of the groove 12G, and the pad electrode 27 is formed as a Schottky electrode for the p-clad layer 15. A feed wire is connected to the pad electrode 27, and thereby the device can be fed externally.

[LEDs of the Embodiment and a Comparative Example]

Figure 4:
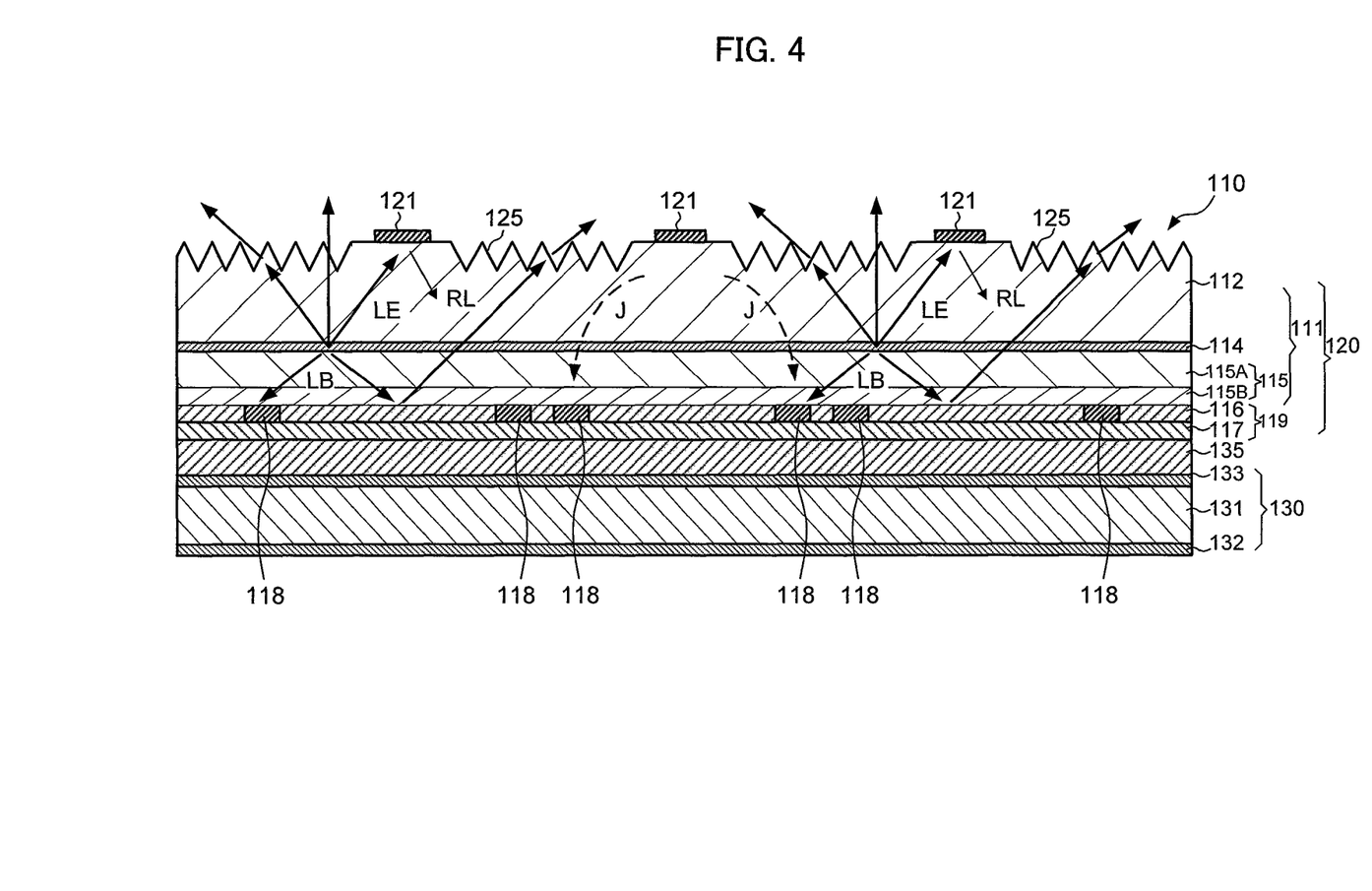
FIG. 4 is a schematic cross-sectional view of a light emitting device that is a comparative example for the embodiment of the present invention.

FIG. 4 shows a schematic cross-sectional view of a light emitting device (LED) 110 that is a comparative example for the above embodiment 1. In the LED 110, although a reflective layer 119 and a semiconductor structure layer 111 are provided on a support substrate 131 via a junction layer 135, no grooves which reach a first semiconductor layer 112 that is a semiconductor layer on the light extraction surface side of a light emitting layer 114 are provided as opposed to Embodiment 1. Thus, ohmic electrodes 121 for the first semiconductor layer 112 are provided above light extraction structures 125. A second semiconductor layer 115 is composed of a clad layer 115A and a contact layer 115B, and ohmic electrodes 118 that form ohmic contact with the second semiconductor layer 115 (contact layer 115B) are provided. Thus, the light emitting layer 114 opposite the ohmic electrode 121 exists under the ohmic electrode 121 of the first semiconductor layer 112. Further, as opposed to Embodiment 1, no through holes are needed, and the ohmic electrodes 121 are connected to a pad electrode provided on the first semiconductor layer 112. Except for these points, the comparative example is the same as Embodiment 1. That is, the light extraction structures 125 are provided in the regions other than the regions where the ohmic electrodes 121 are formed, and the comparative example has the so-called counter electrode configuration described previously, and the pad electrode for electrical connection to the outside is provided. Except that the ohmic electrodes 121 are provided on the surface of the first semiconductor layer 112 (not in the first semiconductor layer 112), the electrode configuration including the electrode arrangement and electrode length and width is the same as that of Embodiment 1 in top plan view seen in a direction perpendicular to the surface of the first semiconductor layer 112 that is the light extraction surface.

As shown in FIG. 4, in the LED 110 of the comparative example, the ohmic electrodes 121 opposite the light emitting layer 114 are provided above the light emitting layer 114, that is, on the light extraction surface side of the light emitting layer 114, and hence part of light (indicated by arrows LE in the figure) directed from the light emitting layer 114 toward the surface (light extraction surface) of the first semiconductor layer 112, is blocked by the ohmic electrodes 121. Part of the blocked light is absorbed by the electrodes. Another part (indicated by arrows RL in the figure) is reflected by the back surfaces of the electrodes and needs to be reflected again before reaching the light extraction surface again, which causes reflection loss. Also an increase in optical path length because of the optical path until reaching the light extraction surface again causes absorption in the semiconductor layer. Thus, light blocked by the electrodes is large in loss, and the efficiency of light extraction from the semiconductor structure layer 111 is greatly reduced.

Further, as to light directed toward the reflective layer 119 from the light emitting layer 114 (indicated by arrows LB in the figure), the ohmic electrodes 118 are low in reflectivity than the other part of the reflective layer 119, and thus the light extraction efficiency is reduced due to light absorption loss.

In contrast, as shown in FIG. 1, in the LED 10 of Embodiment 1, no electrodes exist in positions opposite the light emitting layer 14 on the light extraction surface side of the light emitting layer 14. Hence, light emitted from the light emitting layer 14 is prevented from being blocked, and thus there is no loss due to the electrodes, resulting in an improvement in the light output of the light emitting device (LED).

Further, because in the region where the groove 12G is formed, no electrode (ohmic electrode) of low reflectivity exists below the light emitting layer 14 (that is, on the reflective layer 19 side), reflection loss due to electrodes is less, resulting in an improvement in the light output of the LED. The present invention is quite effective especially when the electrode width is enlarged for higher output of the LED.

More specifically, in the case of LEDs of the conventional counter electrode configuration, in general, the coverage of the electrodes for the element area (emission area) of the first and second semiconductor layers is each 5 to 15%, and accordingly the light output is reduced because of light being blocked and reflection loss. For example, the coverage of the ohmic electrodes on the light extraction surface side and of the ohmic electrodes on the reflective layer side is 6% and 15% respectively with the total coverage being greater than 20%, and thus the effect of the present invention of suppressing loss due to these electrodes is large. According to the present invention, a reduction in light output due to electrodes blocking light and reflection loss can be avoided, thus improving the light extraction efficiency. Further, the present invention can provide a semiconductor light emitting device small in carrier overflow and having high luminous efficiency and high light output linearity which is of high reliability and less likely to degrade.

In particular, in the case of LEDs in which AlGaAs- or AlGaInP-based material is used, an alloy layer between metal of the ohmic electrodes and the semiconductor layer needs to be formed in order to form ohmic electrodes. Because forming the alloy layer greatly reduces the reflectivity of the ohmic electrodes, the configuration of the present invention is further advantageous.

[Effect of Side Surfaces of Groove 11G on the Reflective Surface Side]

In this embodiment, the grooves 11G are formed from the reflective layer side forming the reflective surface, and the length of the edge surfaces of the semiconductor structure layer 11 formed by the grooves 11G (or the side surfaces at which the light emitting layer 14 is exposed) is set to be greater than the length of the periphery of the LED 10. With the grooves 11G formed, light propagating inside the semiconductor layer is changed in propagation direction by reflection at the edge surface of the semiconductor layer, thus improving the light extraction efficiency of the LED 10. In particular, the light emitting layer 14 from among the layers forming the semiconductor structure layer 11 is higher in refractive index than the n-type and p-type semiconductor layers (clad layers), and thus more light propagates inside. Accordingly, increasing the edge surfaces of the light emitting layer 14 is an important factor for improving the light extraction efficiency. That is, the LED 10 of the present invention has a configuration wherein with the grooves 11G, 12G extending through the active layer 14 being formed, light propagating inside is actively extracted outside by reflection at the groove side surfaces (the edge surfaces of the semiconductor layer). Therefore, the LED 10 has an advantageous effect in terms of the light extraction efficiency because the grooves extending through the active layer 14 are formed, as compared with the conventional one. That is, in this invention, light propagating inside is actively extracted outside by reflection at the groove side surfaces (the edge surfaces of the semiconductor layer). The greater length of the groove side surfaces results in an increase in the amount of light extracted by reflection at the edge surfaces. In the above configuration, the grooves 11G, 12G were formed such that the ratio of the edge surfaces of the semiconductor layer, that is, (the length of the edge surfaces of the semiconductor layer inside the LED plus the periphery length)/the periphery length equals 1.9.

[Inclination Angles of Grooves 11G, 12G]

As described above, in Embodiment 1, by forming the grooves 11G, 12G, light emitted from the light emitting layer 14 is prevented from being blocked, thus reducing loss due to the electrodes. Hence, the light extraction efficiency and light output of the LED 10 are improved.

Figure 5:
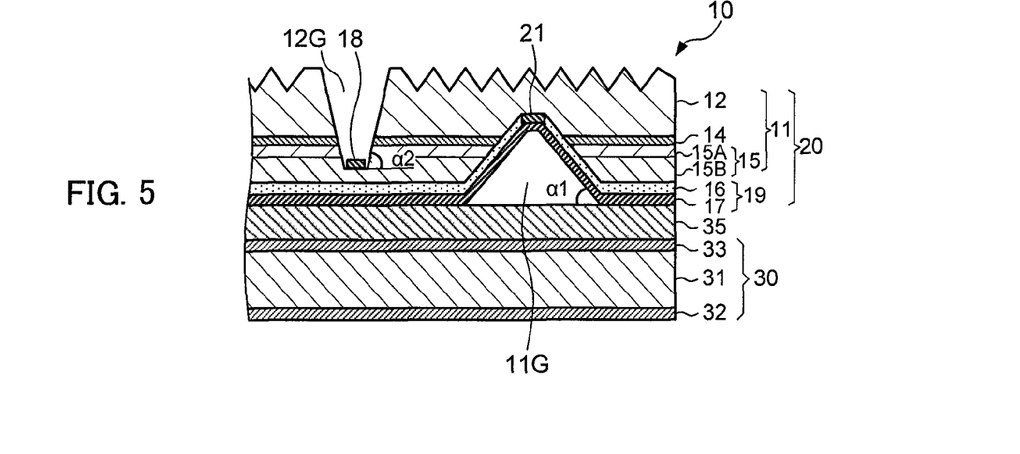
FIG. 5 is a cross-sectional view showing inclination angles $\alpha 1$ and $\alpha 2$ of edge surfaces of the semiconductor structure layer formed by first and second grooves.

In Embodiment 1, by adjusting angles (inclination angles) $\alpha 1$ and $\alpha 2$ (FIG. 5) formed by the edge surfaces of the semiconductor structure layer 11 (or the side surfaces of the grooves 11G and 12G) formed by the grooves 11G and 12G, the light extraction efficiency can be further improved. This point will be described with reference to the drawings.

Figure 6A:
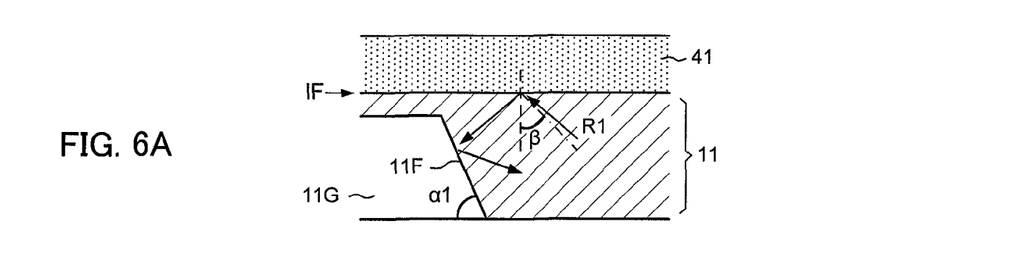
FIGS. 6A, 6B, 6C are schematic cross-sectional views showing part of the first groove with different inclination angles of the LED in enlarged view.
Figure 6B:
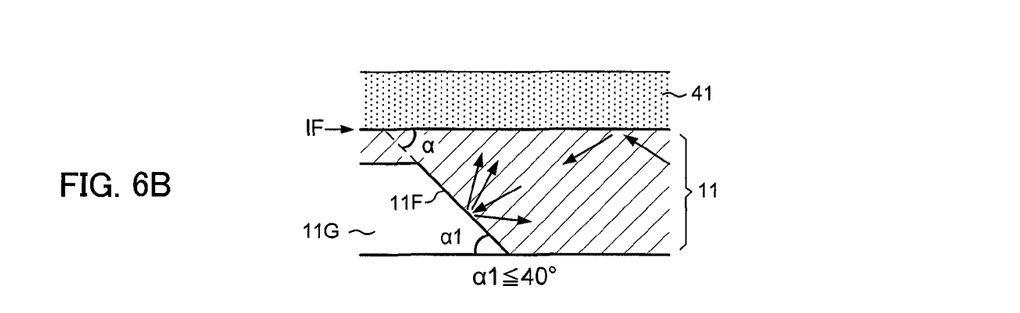
Figure 6C:
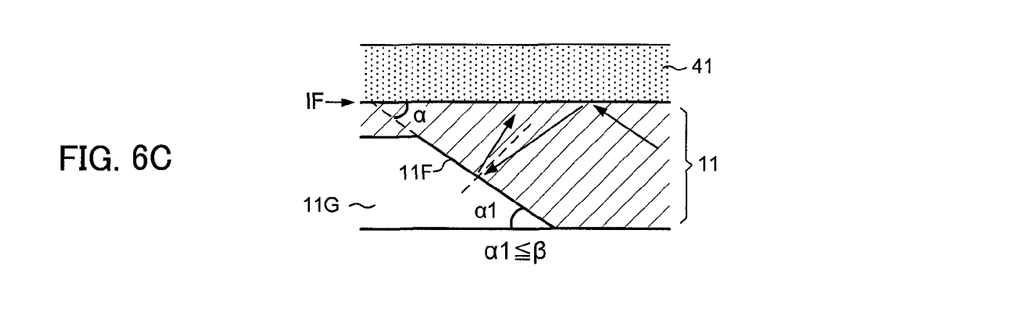

First, the inclination angle (first inclination angle) al of the edge surfaces of the semiconductor structure layer 11 formed by the grooves 11G will be described. FIGS. 6A, 6B, 6C are schematic cross-sectional views showing part of the groove 11G of the LED 10 in enlarged view, and mainly show the form of an edge surface of the semiconductor structure layer 11 (a side surface of the groove 11G) with details of the configuration of the semiconductor structure layer 11, the insulating layer 16, the metal layer 17, the reflective layer 19, and so on being omitted for ease of description and understanding. The case where with no light extraction structure being formed in the surface of the first semiconductor layer (n-clad layer) 12 that is the light extraction surface, the surface of the first semiconductor layer 12 is a flat light extraction surface will be described for ease of description and understanding of light ray paths. That is, the case where the surface of the first semiconductor layer 12 is a flat surface parallel to the crystal growth surface (i.e., parallel to the light emitting layer 14) will be described.

In FIGS. 6A, 6B, 6C, an external medium 41 of a refractive index $n_{AMB}$ is shown on the semiconductor structure layer 11. For example, if the external medium 41 is not provided (that is, the surface of the semiconductor structure layer 11 is exposed to air), then the refractive index $n_{AMB}=n_{AIR}$ (about 1.0). Description will be made below taking as an example the case where a resin of a refractive index $n_{AMB}$ (=1.5) is provided as the external medium 41.

As shown in FIG. 6A, a light component R1, whose incident angle is no less than the critical angle $\beta$, of light emitted from the light emitting layer 14 of the semiconductor structure layer 11 and incident on the surface of the first semiconductor layer 12 (that is, the interface IF between the semiconductor structure layer 11 and the external medium 41) is reflected and not extracted. Further, light reflected at the interface IF is reflected at the edge surface 11F of the semiconductor structure layer 11. If the angle (hereinafter called an inclination angle) $\alpha 1$ which the edge surface 11F of the semiconductor structure layer 11 forms with the semiconductor structure layer 11 (that is, the surface of the first semiconductor layer 12) is large, then the amount of light propagating inside and reflected to the reflective layer side, not to the light extraction surface side increases, and hence it is not preferable. Accordingly, supposing an isotropic emission light source RS inside the semiconductor structure layer 11, simulation according to a ray tracing method taking into account the solid angle of radiant light was performed, and the following results were obtained. Note that the groove 11G is formed in a forward tapered shape in which the opening area becomes smaller when going in an internal direction of the semiconductor structure layer 11 (that is, in the direction from the second semiconductor layer 15 to the first semiconductor layer 12) and that the inclination angle $\alpha 1$ is defined as $0<\alpha1<90°$. In other words, the edge surface of the semiconductor structure layer 11 (i.e., a side surface of the groove 11G) formed by or exposed at the groove 11G slopes in such a direction that light emanating from the edge surface of the light emitting layer 14 is reflected by the reflective layer 19 to the light extraction surface side.

As a result of the above simulation, it was found out that as shown in FIG. 6B, conditions in which 80% or more of light reflected at the light extraction surface (interface IF) and incident on the edge surface 11F of the semiconductor structure layer 11 is reflected to the light extraction surface (interface IF) side are the inclination angle $\alpha1$ of the edge surface 11F being no greater than 40°. That is, when the inclination angle $\alpha1$ of the edge surface 11F is no greater than 40° ($\alpha1 \leq 40°$), 80% or more of light reflected at the interface IF and incident on the edge surface 11F is reflected to the light extraction surface (interface IF) side, regardless of the semiconductor composition of the semiconductor structure layer 11. Note that when the inclination angle $\alpha1$ is no less than 60°, half of light incident on the edge surface 11F is reflected not to the light extraction surface side but to the reflective surface side.

Further, as shown in FIG. 6C, it was found out that when the inclination angle $\alpha1$ of the edge surface 11F is no greater than the critical angle $\beta$ ($\alpha1 \leq \beta$), all of light reflected at the interface IF and incident on the edge surface 11F is reflected to the light extraction surface (interface IF) side. For example, assuming that the refractive index $n_{AMB}$ of the external medium 41 equals 1.5, then with the refractive index n(GaN) of a GaN-based semiconductor equal to 2.5, the critical angle $\beta$ is 37°. For the AlGaInP-based semiconductor, n(AlGaInP) =3.3, and the critical angle $\beta$ is 27°. In the figure, a broken line indicates a perpendicular line to the edge surface 11F.

As described above, by adjusting the inclination angle $\alpha1$ of the edge surface 11F of the semiconductor structure layer 11, reflected light can be effectively extracted through the light extraction surface, and a light emitting device excellent at light extraction efficiency can be obtained. This example can be applied to any of the above embodiments.

Although the case where no light extraction structure is formed in the surface of the first semiconductor layer 12 that is the light extraction surface and where thus the surface is flat has been described, a light extraction structure may be formed. Even in this case, light reflected by the light extraction surface and incident on the edge surface 11F of the semiconductor structure layer 11, and light incident on the edge surface 11F from inside the semiconductor structure layer are reflected by the edge surface 11F to the light extraction surface side with high probability, and thus the edge surface is effective.

Figure 7A:
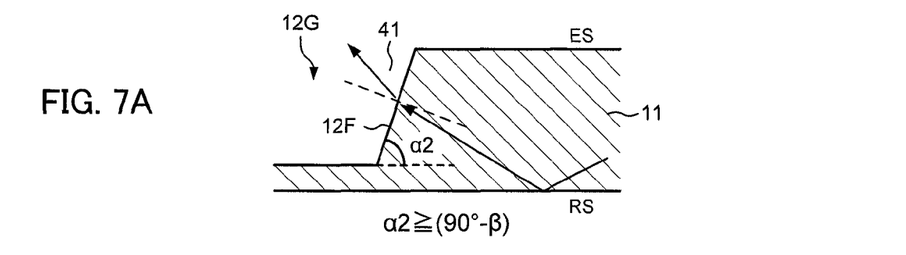
FIGS. 7A, 7B, 7C are schematic cross-sectional views showing part of the second groove with different inclination angles of the LED in enlarged view.
Figure 7B:
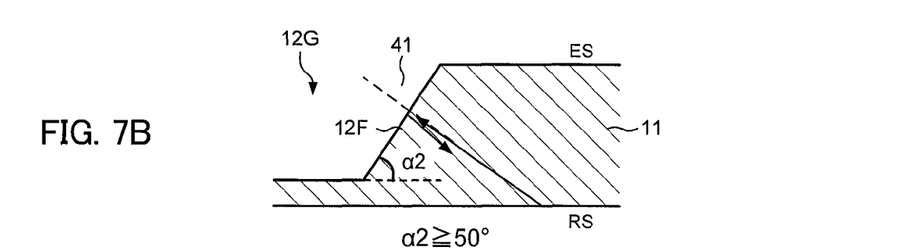
Figure 7C:
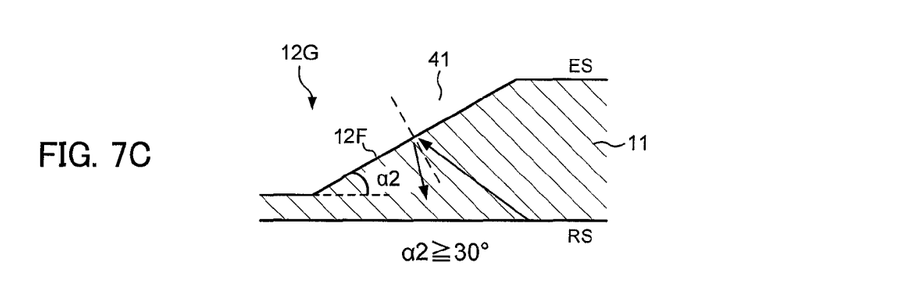

Next, the inclination angle (second inclination angle) $\alpha2$ of the edge surface of the semiconductor structure layer 11 formed by the groove 12G will be described. FIGS. 7A, 7B, 7C are schematic cross-sectional views showing part of the groove 12G of the LED 10 in enlarged view, and mainly show the form of an edge surface of the semiconductor structure layer 11 (a side surface of the groove 12G) with details of the configuration of the semiconductor structure layer 11, the insulating layer 16, the metal layer 17, the reflective layer 19, and so on being omitted for ease of description and understanding, as in the above description of the inclination angle $\alpha1$ of the groove 11G. The case where with no light extraction structure being formed in the surface of the first semiconductor layer (n-clad layer) 12 that is the light extraction surface, the surface of the first semiconductor layer 12 is a flat light extraction surface will be described for ease of description and understanding of light ray paths. That is, the case where the surface of the first semiconductor layer 12 is a flat surface parallel to the crystal growth surface (i.e., parallel to the light emitting layer 14) will be described. Description will be made assuming that the external medium 41 of a refractive index $n_{AMB}$ exists on the semiconductor structure layer 11.

With the groove 12G on the light extraction surface side, by adjusting the angle (inclination angle) $\alpha2$ of the edge surface of the semiconductor structure layer 11 (a side surface of the groove 12G), reflected components can be effectively extracted as with the groove 11G on the reflective surface side. As described later, the inclination angle $\alpha2$ differs in the range of preferable inclination angles from the inclination angle $\alpha1$ of the groove 11G on the reflective surface side. Simulation according to the ray tracing method was performed as in the examination of the inclination angle of the groove 11G on the reflective surface side. As shown in FIGS. 6, 7A to 7C, the groove 12G is formed in a forward tapered shape in which the opening area becomes smaller when going in an internal direction of the semiconductor structure layer 11 (that is, in the direction from the first semiconductor layer 12 to the second semiconductor layer 15), and the inclination angle $\alpha2$ is defined as $0<\alpha2<90°$. In other words, the edge surface of the semiconductor structure layer 11 (i.e., a side surface of the groove 12G) formed by or exposed at the groove 12G slopes in such a direction as to face the light extraction surface (the surface of the first semiconductor layer 12) (inclination angle $\alpha2$).

As shown in FIG. 7A, letting $\beta$ be the critical angle from the semiconductor structure layer 11 to the external medium 41 as above, when the inclination angle $\alpha2$ is no less than $90°-\beta$ ($\alpha2 \geq 90°-\beta$), all of light incident on the edge surface 12F of the semiconductor structure layer 11 is directed to the light extraction surface (surface of the first semiconductor layer 12) ES side, and thus the light output of the LED 10 improves. In the figure, a broken line indicates a perpendicular line to the edge surface 12F.

In contrast, as the inclination angle $\alpha2$ becomes smaller, the amount of light reflected to the reflective surface RS side, not to the light extraction surface ES side increases, and hence it is not preferable (FIGS. 7B, 7C). In particular, when the inclination angle $\alpha2$ of the edge surface 12F is no greater than 30°, half of light incident on the edge surface 12F is reflected to the reflective surface RS side, not to the light extraction surface ES, thus reducing light extraction efficiency (FIG. 7C). According to the simulation according to the ray tracing method, the inclination angle $\alpha2$ of the edge surface 12F needs to be no less than 50° so that 80% or more of light incident on the edge surface 12F is reflected to the light extraction surface ES side ($\alpha2 \geq 50°$, FIG. 7B).

Note that the grooves 11G, 12G can be formed by wet or dry etching. At that time, anisotropy in the etching may occur depending on the composition and layer configuration of the semiconductor layer, but the edge surfaces 11F, 12F of the semiconductor structure layer 11 formed by the etching need only have the inclination angles $\alpha1$ and $\alpha2$ overall. Or the edge surfaces 11F, 12F need only include slopes of the inclination angles $\alpha1$ and $\alpha2$ respectively.

[Current Spread]

In FIGS. 1 and 4, paths of current (electron flow) J in Embodiment 1 and the comparative example respectively are indicated schematically by broken-line arrows. In the configuration of Embodiment 1, grooves are formed extending through the light emitting layer, but because the ohmic electrodes for the first semiconductor layer and the ohmic electrodes for the second semiconductor layer are in a counter arrangement configuration, by configuring the grooves in an appropriate range, the light output of the LED can be improved with maintaining as much or more current spread than that of the comparative example.

More specifically, where the grooves 11G are formed on the reflective layer side, there is a worry that the effective thickness of the semiconductor layer (the first semiconductor layer 12) on the light extraction surface side is reduced, as compared with the comparative example where the ohmic electrodes are formed on the light extraction surface, thus causing a rise in the forward voltage. However, it is sufficiently possible to prevent a rise in the forward voltage by increasing the depth of the grooves formed in the first semiconductor layer. Alternatively, by designing the thickness of the first semiconductor layer and carrier concentration, and so on appropriately, a rise in the forward voltage, a decrease in current spread, and the like can be prevented.

Specifically, it is preferable to set the depth of the grooves in the first semiconductor layer to be 0.5 μm or greater, more preferably 1.0 μm or greater. Where the light extraction structure is formed, enough thickness to form the light extraction structure needs to remain. Further, although the smaller width of the grooves advantageously results in the area to be processed in the light emitting layer being smaller, the width should be enough to arrange and wire the ohmic electrodes for the first semiconductor layer, for example, 1.0 μm or greater, more preferably 3 μm or greater.

The same applies to where the grooves 12G are formed on the light extraction surface side, as where the grooves 11G are formed on the reflective layer side.

Embodiment 2

Figure 8:
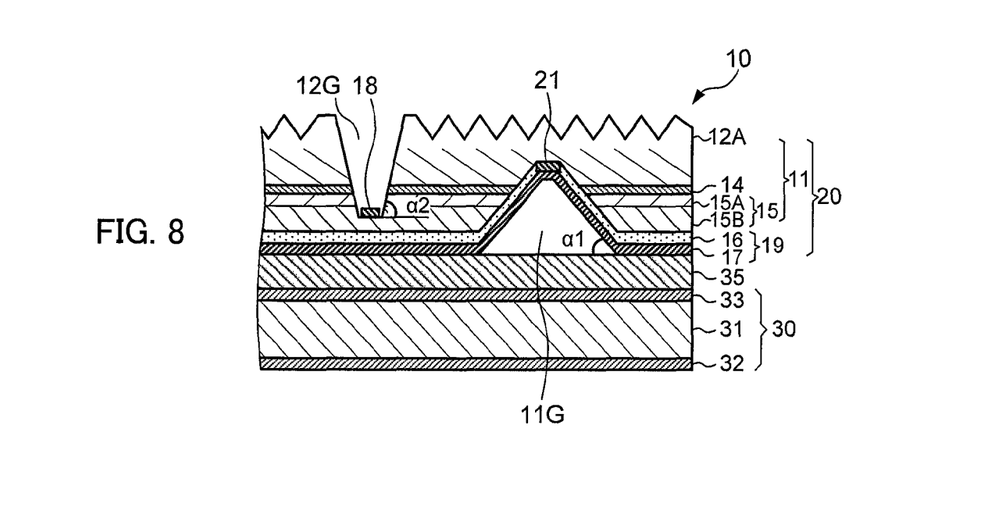
FIG. 8 is a fragmentary cross-sectional view schematically showing part of a cross-section of a light emitting device (LED) that is Embodiment 2 of the present invention.

FIG. 8 is a fragmentary cross-sectional view schematically showing part of a cross-section of a light emitting device (LED) 10 that is Embodiment 2 of the present invention. The present embodiment differs from the LED 10 of Embodiment 1 in that the first semiconductor layer is composed of an undoped layer 12A and an n-clad layer 12B.

More specifically, the undoped layer 12A of 0.5 μm thickness and the n-clad layer 12B of 3.5 μm thickness and a high carrier concentration of $2\times10^{18}$ cm$^{-3}$ are grown on a growth substrate, and further as in Embodiment 1, a light emitting layer 14 of 0.5 μm thickness, a p-clad layer 15A of $(Al_zGa_{1-z})_{0.5}In_{0.5}P$ in composition and 1.0 μm thickness, and a p-contact layer 15B of $Ga_{1-x}In_xP$ (x=0.1) in composition and 1.5 μm thickness are sequentially epitaxial-grown one over another to form the semiconductor structure layer 11. Subsequently, the removal of the growth substrate makes the undoped layer 12A exposed to become a light extraction surface. Then a hole/protrusion structure 25 (a photonic crystal) for improving the light extraction efficiency is formed in the exposed surface of the undoped layer 12A. The hole/protrusion structure 25 is formed to have a depth that does not reach the n-clad layer 12B.

In Embodiment 2, grooves 11G of 2.0 μm depth are formed in the first semiconductor layer 12 (4.0 μm thickness). More specifically, the processing depth for the n-clad layer 12B is set at 2.0 μm for 3.5 μm thickness of the n-clad layer 12B. As in Embodiment 1, n-electrodes 21 that are ohmic electrodes for the n-clad layer 12B are formed in the bottom of the grooves 11G.

According to Embodiment 2, the first semiconductor layer 12 is composed of the undoped layer 12A and the n-clad layer 12B, in that order from the light extraction side, and the n-electrodes 21 that are ohmic electrodes for the n-clad layer 12B are formed. Instead of the undoped layer 12A not intentionally doped, an n-layer of a lower carrier concentration (e.g., $5\times10^{17}$ cm$^{-3}$ or less) than the n-clad layer 12B may be used. In other words, the configuration is adopted where the semiconductor layer (first semiconductor layer) on the light extraction surface side of the light emitting layer is of a laminated structure (in Embodiment 2, a two-layered structure) and where the carrier concentration of the outermost semiconductor layer on the light extraction surface side is set lower than that of the other semiconductor layer.

That is, in the previously-described comparative example, because ohmic electrodes are formed on the light extraction surface, the outermost part of the semiconductor layer on the light extraction surface side needs to be a layer doped in a high concentration (e.g., a carrier concentration of $1\times10^{18}$ cm$^{-3}$ or greater) in order to obtain ohmic contact of low resistance. However, the high-concentration layer to form ohmic contact is large in light absorption due to free carriers, thus causing a reduction in the light output of the LED. In particular, where a light extraction structure is formed in the surface, light incident on the light extraction structure is scattered, diffracted, and reflected by the light extraction structure, and thus loss to which light is subjected before extracted is large if the light extraction structure itself absorbs.

As described above, by lowering the carrier concentration of the outermost semiconductor layer on the light extraction surface side, light absorption loss due to free carriers can be reduced, and in addition the light output can be increased.

Embodiment 3

The GaN-based light emitting diode (LED) 10 that is Embodiment 3 of the present invention will be described below with reference to FIGS. 1, 3. Referring to FIG. 3, the semiconductor structure layer of Embodiment 3 is formed by sequentially epitaxial-growing an n-type GaN clad layer (first semiconductor layer) 12 of 5.0 μm thickness, a light emitting layer 14 of 75 nm thickness, and a second semiconductor layer 15 composed of a p-type $Al_{0.2}Ga_{0.2}N$ layer 15A of 40 nm thickness and a p-type GaN clad layer 15B of 100 nm thickness one over another on a (0001) plane of a sapphire substrate 10A by the MOCVD method. The light emitting layer 14 may be a multiple quantum well (MQW) layer, a single quantum well (SQW) layer, or a single layer.

The multiple quantum well structure is composed of 5 pairs of a well layer and a barrier layer, the well layer being an $In_xGa_{1-x}N$ layer (composition x=0.35) of 2 nm thickness, the barrier layer being a GaN barrier layer of 14 nm thickness. Note that the In composition x of the well layer is adjusted within the range of 0≤x≤1.0 according to the emission wavelength.

Using the semiconductor structure layer 11 formed in this way, the GaN-based LED 10 is formed by the same process as the AlGaInP-based LED. That is, after the first grooves 11G, the insulating layer 16, the n-electrodes 21, and the reflective metal layer 17 are formed in and on the semiconductor structure layer 11, the GaN-based LED 10 is formed by undergoing bonding to the conductive support body 30, removal of the growth substrate 10A, formation of the second grooves 12G in the light extraction surface, and formation of the p-electrodes.

Also with the GaN-based LED having this configuration, as in Embodiment 1, a reduction in light output due to electrodes blocking light and reflection loss can be avoided, thus improving the light extraction efficiency. Further, the present embodiment can provide a semiconductor light emitting device small in carrier overflow and having high luminous efficiency and high light output linearity which is of high reliability and less likely to degrade. Yet further, as in Embodiment 1, this device does not suffer a decrease in current spread and a rise in the forward voltage.

Also, the present embodiment is the same as the above embodiment in that by adjusting the inclination angles α1 and α2 of the edge surfaces of the semiconductor structure layer 11 (side surfaces of the grooves 11G and 12G) formed by the grooves 11G and 12G, light extraction efficiency can be improved. It was confirmed through the previously-described simulation that for the GaN-based LED, the angle range of the inclination angles α1 and α2 required to improve light extraction efficiency is substantially the same as for the AlGaInP-based LED of Embodiment 1.

Moreover, as in Embodiment 2, the first semiconductor layer can be configured to be of a laminated structure of a high carrier-concentration layer and a low carrier-concentration layer (or undoped layer), and by making the semiconductor layer on the light extraction surface side be of a low carrier concentration, absorption due to free carriers can be suppressed, and the output of the LED can be further improved.

In general, for the GaN-based LED grown on a sapphire substrate, in order to reduce crystal defects due to the difference in lattice constant between the substrate and the grown crystal, the GaN layer before the light emitting layer is formed is grown to be, e.g., 3.0 μm or greater, preferably 5.0 μm in thickness, so as to improve crystallinity. However, doped n-type GaN is lower in crystallinity than undoped GaN, and in addition irregularity in the surface is larger, resulting in an element characteristic such as luminous efficiency being lower. Therefore, according to the present invention, because a doped (e.g., Si-doped) n-type GaN layer can be formed on undoped GaN good in crystallinity, crystallinity is improved over the case where the entire first semiconductor layer is doped, and also absorption due to free carriers is eliminated. Hence, an element characteristic such as luminous efficiency of the LED can be improved. Although the undoped GaN layer is more preferable, instead of the undoped GaN layer, a GaN layer of a low carrier concentration can be used to improve the element characteristic because it has the effect of improving crystallinity.

As described in detail above, according to the present invention, there can be provided a semiconductor light emitting device, wherein light extraction efficiency is improved, having high luminous efficiency and high light output linearity which is of high reliability and less likely to degrade.

The above embodiments can be combined or changed as needed to apply. Further, materials, numerical values, and so on mentioned above are only illustrative.

This application is based on Japanese Patent Application No. 2012-172939 which is herein incorporated by reference.

What is claimed is:

1. A light emitting device which has a semiconductor structure layer having a first semiconductor layer, a light emitting layer, and a second semiconductor layer of a conductivity type opposite to that of said first semiconductor layer sequentially laid one over another, a surface of said first semiconductor layer being a light extraction surface, said light emitting device comprising:
   a first groove extending from a second semiconductor layer side through said second semiconductor layer and said light emitting layer to said first semiconductor layer;
   a first ohmic electrode formed in contact with said first semiconductor layer in said first groove;
   an insulating layer covering a surface of said second semiconductor layer and at least the surface of part of said light emitting layer exposed in said first groove;
   a metal layer covering the surface of said insulating layer and connected to said first ohmic electrode;
   a second groove extending from a first semiconductor layer side through said first semiconductor layer and said light emitting layer to said second semiconductor layer;
   a second ohmic electrode formed in contact with said second semiconductor layer in said second groove; and
   a support body bonded to said metal layer via a junction layer.

2. A light emitting device according to claim 1, wherein said first groove is formed in a forward tapered shape in which its opening area becomes smaller when going further into said semiconductor structure layer, and a first inclination angle α1 (0<α1<90°) of an edge surface of said semiconductor structure layer formed by said first groove with respect to said semiconductor structure layer is no greater than 40°.

3. A light emitting device according to claim 1, wherein said second groove is formed in a forward tapered shape in which its opening area becomes smaller when going further into said semiconductor structure layer, and a second inclination angle α2 (0<α2<90°) of an edge surface of said semiconductor structure layer formed by said second groove with respect to said semiconductor structure layer is no less than 50°.

4. A light emitting device according to claim 2, wherein said second groove is formed in a forward tapered shape in which its opening area becomes smaller when going further into said semiconductor structure layer, and a second inclination angle α2 (0<α2<90°) of an edge surface of said semiconductor structure layer formed by said second groove with respect to said semiconductor structure layer is no less than 50°.

5. A light emitting device according to claim 2, wherein said first inclination angle is no greater than the critical angle at the interface between said first semiconductor layer and an external medium in contact with said first semiconductor layer.

6. A light emitting device according to claim 3, wherein said first inclination angle is no greater than the critical angle at the interface between said first semiconductor layer and an external medium in contact with said first semiconductor layer.

7. A light emitting device according to claim 4, wherein said first inclination angle is no greater than the critical angle at the interface between said first semiconductor layer and an external medium in contact with said first semiconductor layer.

8. A light emitting device according to claim 3, wherein letting b be the critical angle at the interface between said first semiconductor layer and an external medium in contact with said first semiconductor layer, said second inclination angle is no less than (90°−b).

9. A light emitting device according to claim 4, wherein letting b be the critical angle at the interface between said first semiconductor layer and an external medium in contact with said first semiconductor layer, said second inclination angle is no less than (90°−b).

10. A light emitting device according to claim 5, wherein letting β be the critical angle at the interface between said first semiconductor layer and an external medium in contact with said first semiconductor layer, said second inclination angle is no less than (90°−β).

11. A light emitting device according to claim 6, wherein letting β be the critical angle at the interface between said first semiconductor layer and an external medium in contact with said first semiconductor layer, said second inclination angle is no less than (90°−β).

12. A light emitting device according to claim 7, wherein letting β be the critical angle at the interface between said first semiconductor layer and an external medium in contact with said first semiconductor layer, said second inclination angle is no less than (90°−β).

13. A light emitting device according to claim 1, wherein said first semiconductor layer is composed of a high carrier-concentration semiconductor layer having a relatively high carrier concentration and formed on said light emitting layer and a low carrier-concentration semiconductor layer having a carrier concentration lower than that of said high carrier-concentration semiconductor layer, and said first ohmic electrode is formed in contact with said high carrier-concentration semiconductor layer.

14. A light emitting device according to claim 13, wherein a light extraction hole/protrusion structure is formed in the surface of said low carrier-concentration semiconductor layer, and said light extraction hole/protrusion structure is formed to have a depth that does not reach said high carrier-concentration semiconductor layer.

15. A light emitting device according to claim 13, wherein said low carrier-concentration semiconductor layer has a carrier concentration of no greater than $5\times10^{17}$ cm$^{-3}$.

16. A light emitting device according to claim 14, wherein said low carrier-concentration semiconductor layer has a carrier concentration of no greater than $5\times10^{17}$ cm$^{-3}$.

17. A light emitting device according to claim 13, wherein said low carrier-concentration semiconductor layer is an undoped layer.

18. A light emitting device according to claim 14, wherein said low carrier-concentration semiconductor layer is an undoped layer.

19. A light emitting device according to claim 1, wherein said semiconductor structure layer is a GaN-based light emitting diode structure layer.

* * * * *